(12) United States Patent
Xi et al.

(10) Patent No.: US 7,220,673 B2
(45) Date of Patent: *May 22, 2007

(54) METHOD FOR DEPOSITING TUNGSTEN-CONTAINING LAYERS BY VAPOR DEPOSITION TECHNIQUES

(75) Inventors: Ming Xi, Milpitas, CA (US); Ashok Sinha, Palo Alto, CA (US); Moris Kori, Palo Alto, CA (US); Alfred W. Mak, Union City, CA (US); Xinliang Lu, Sunnyvale, CA (US); Ken Kaung Lai, Milpitas, CA (US); Karl A. Littau, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/461,909

(22) Filed: Aug. 2, 2006

(65) Prior Publication Data

US 2006/0264031 A1    Nov. 23, 2006

Related U.S. Application Data

(63) Continuation of application No. 09/678,266, filed on Oct. 3, 2000, now Pat. No. 7,101,795, which is a continuation-in-part of application No. 09/605,593, filed on Jun. 28, 2000, now Pat. No. 6,551,929.

(51) Int. Cl.
    *H01L 21/44* (2006.01)
(52) U.S. Cl. ............................... 438/685; 257/E21.168
(58) Field of Classification Search ............... 438/685
    See application file for complete search history.

(56) References Cited

U.S. PATENT DOCUMENTS

| | | |
|---|---|---|
| 5,306,666 A | 4/1994 | Izumi |
| 5,526,244 A | 6/1996 | Bishop |
| 5,804,488 A | 9/1998 | Shih et al. |
| 5,834,372 A | 11/1998 | Lee |
| 6,015,917 A | 1/2000 | Bhandari et al. |
| 6,026,967 A | 3/2000 | Mak et al. |
| 6,099,904 A | 8/2000 | Mak et al. |

(Continued)

OTHER PUBLICATIONS

Cameron, et al. "Atomic Layer Deposition of $SiO_2$ and $TiO_2$ in Alumina Tubular Membranes: Pore Reduction and Effect of Surface Species on Gas Transport," Langmuir, vol. 16, No. 19, American Chemical Society, 2000, pp. 7435-7444.

(Continued)

*Primary Examiner*—David A. Zarneke
(74) *Attorney, Agent, or Firm*—Patterson & Sheridan, LLP

(57) ABSTRACT

In one embodiment, a method for forming a tungsten-containing material on a substrate is provided which includes forming a tungsten nucleation layer by sequentially exposing a substrate to a boron-containing gas and a tungsten-containing gas within a processing chamber during an atomic layer deposition process, and forming a tungsten bulk layer on the tungsten nucleation layer by exposing the substrate to a processing gas that contains the tungsten-containing gas and a reactive precursor gas within another processing chamber during a chemical vapor deposition process. In one example, the tungsten nucleation layer is deposited on a dielectric material, such as silicon oxide. In another example, the tungsten nucleation layer is deposited on a barrier material, such as titanium or titanium nitride. Other examples provide that the tungsten nucleation layer and the tungsten bulk layer are deposited in the same processing chamber.

38 Claims, 8 Drawing Sheets

U.S. PATENT DOCUMENTS

| | | |
|---|---|---|
| 6,156,382 A | 12/2000 | Rajagopalan et al. |
| 6,207,487 B1 | 3/2001 | Kim et al. |
| 6,218,298 B1 | 4/2001 | Hoinkis |
| 6,274,484 B1 | 8/2001 | Tsai et al. |
| 6,284,646 B1 | 9/2001 | Leem |
| 6,326,297 B1 | 12/2001 | Vijayendran |
| 6,333,260 B1 | 12/2001 | Kwon et al. |
| 6,335,280 B1 | 1/2002 | van der Jeugd |
| 6,342,277 B1 | 1/2002 | Sherman |
| 6,348,376 B2 | 2/2002 | Lim et al. |
| 6,355,561 B1 | 3/2002 | Sandhu et al. |
| 6,358,829 B2 | 3/2002 | Yoon et al. |
| 6,368,954 B1 | 4/2002 | Lopatin et al. |
| 6,369,430 B1 | 4/2002 | Adetutu et al. |
| 6,372,598 B2 | 4/2002 | Kang et al. |
| 6,379,748 B1 | 4/2002 | Bhandari et al. |
| 6,391,785 B1 | 5/2002 | Satta et al. |
| 6,399,491 B2 | 6/2002 | Jeon et al. |
| 6,416,822 B1 | 7/2002 | Chiang et al. |
| 6,420,189 B1 | 7/2002 | Lopatin |
| 6,423,619 B1 | 7/2002 | Grant et al. |
| 6,428,859 B1 | 8/2002 | Chiang et al. |
| 6,447,933 B1 | 9/2002 | Wang et al. |
| 6,451,119 B2 | 9/2002 | Sneh et al. |
| 6,451,695 B2 | 9/2002 | Sneh |
| 6,458,701 B1 | 10/2002 | Chae et al. |
| 6,468,924 B2 | 10/2002 | Lee et al. |
| 6,475,276 B1 | 11/2002 | Elers et al. |
| 6,475,910 B1 | 11/2002 | Sneh |
| 6,478,872 B1 | 11/2002 | Chae et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,524,952 B1 | 2/2003 | Srinivas et al. |
| 6,534,395 B2 | 3/2003 | Werkhoven et al. |
| 6,534,404 B1 | 3/2003 | Danek et al. |
| 6,548,424 B2 | 4/2003 | Putkonen |
| 6,551,929 B1 * | 4/2003 | Kori et al. ................. 438/685 |
| 6,569,501 B2 | 5/2003 | Chiang et al. |
| 6,585,823 B1 | 7/2003 | Van Wijck |
| 6,593,484 B2 | 7/2003 | Yasuhara et al. |
| 6,596,602 B2 | 7/2003 | Iizuka et al. |
| 6,599,572 B2 | 7/2003 | Saanila et al. |
| 6,607,976 B2 | 8/2003 | Chen et al. |
| 6,620,723 B1 | 9/2003 | Byun et al. |
| 6,630,201 B2 | 10/2003 | Chiang et al. |
| 6,632,279 B1 | 10/2003 | Ritala et al. |
| 6,635,965 B1 | 10/2003 | Lee et al. |
| 6,660,126 B2 | 12/2003 | Nguyen et al. |
| 6,686,271 B2 | 2/2004 | Raaijmakers et al. |
| 6,784,096 B2 | 8/2004 | Chen et al. |
| 6,790,773 B1 | 9/2004 | Drewery et al. |
| 6,800,173 B2 | 10/2004 | Chiang et al. |
| 6,803,272 B1 | 10/2004 | Halliyal et al. |
| 6,815,285 B2 | 11/2004 | Choi et al. |
| 6,838,125 B2 | 1/2005 | Chung et al. |
| 6,855,368 B1 | 2/2005 | Kori et al. |
| 6,893,915 B2 | 5/2005 | Park et al. |
| 6,936,538 B2 | 8/2005 | Byun |
| 6,958,174 B1 | 10/2005 | Klaus et al. |
| 7,101,795 B1 * | 9/2006 | Xi et al. .................. 438/685 |
| 7,115,494 B2 * | 10/2006 | Sinha et al. ............... 438/607 |
| 2001/0002280 A1 | 5/2001 | Sneh |
| 2001/0009695 A1 | 7/2001 | Saanila et al. |
| 2001/0024387 A1 | 9/2001 | Raaijmakers et al. |
| 2001/0025979 A1 | 10/2001 | Kim et al. |
| 2001/0050039 A1 | 12/2001 | Park |
| 2001/0054730 A1 | 12/2001 | Kim et al. |
| 2001/0054769 A1 | 12/2001 | Raaijmakers et al. |
| 2002/0000598 A1 | 1/2002 | Kang et al. |
| 2002/0004293 A1 | 1/2002 | Soininen et al. |
| 2002/0007790 A1 | 1/2002 | Park |
| 2002/0009544 A1 | 1/2002 | McFeely |
| 2002/0019121 A1 | 2/2002 | Pyo |
| 2002/0020869 A1 | 2/2002 | Park et al. |
| 2002/0021544 A1 | 2/2002 | Cho et al. |
| 2002/0031618 A1 | 3/2002 | Sherman |
| 2002/0037630 A1 | 3/2002 | Agarwal et al. |
| 2002/0041931 A1 | 4/2002 | Suntola et al. |
| 2002/0048635 A1 | 4/2002 | Kim et al. |
| 2002/0048880 A1 | 4/2002 | Lee |
| 2002/0052097 A1 | 5/2002 | Park |
| 2002/0055235 A1 | 5/2002 | Agarwal et al. |
| 2002/0060363 A1 | 5/2002 | Xi et al. |
| 2002/0061612 A1 | 5/2002 | Sandhu et al. |
| 2002/0068458 A1 | 6/2002 | Chiang et al. |
| 2002/0073924 A1 | 6/2002 | Chiang et al. |
| 2002/0074588 A1 | 6/2002 | Lee et al. |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0076837 A1 | 6/2002 | Hujanen et al. |
| 2002/0081844 A1 | 6/2002 | Jeon et al. |
| 2002/0086111 A1 | 7/2002 | Byun et al. |
| 2002/0086507 A1 | 7/2002 | Park et al. |
| 2002/0090829 A1 | 7/2002 | Sandhu et al. |
| 2002/0094689 A1 | 7/2002 | Park |
| 2002/0098627 A1 | 7/2002 | Pomarede et al. |
| 2002/0104481 A1 | 8/2002 | Chiang et al. |
| 2002/0105088 A1 | 8/2002 | Yang et al. |
| 2002/0106536 A1 | 8/2002 | Lee et al. |
| 2002/0106846 A1 | 8/2002 | Seutter et al. |
| 2002/0109168 A1 | 8/2002 | Kim et al. |
| 2002/0115886 A1 | 8/2002 | Yasuhara et al. |
| 2002/0117399 A1 | 8/2002 | Chen et al. |
| 2002/0121241 A1 | 9/2002 | Nguyen et al. |
| 2002/0121342 A1 | 9/2002 | Nguyen et al. |
| 2002/0121697 A1 | 9/2002 | Marsh |
| 2002/0135071 A1 | 9/2002 | Kang et al. |
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0177282 A1 | 11/2002 | Song et al. |
| 2002/0182320 A1 | 12/2002 | Leskela et al. |
| 2002/0187256 A1 | 12/2002 | Elers et al. |
| 2002/0187631 A1 | 12/2002 | Kim et al. |
| 2002/0197402 A1 | 12/2002 | Chiang et al. |
| 2002/0197863 A1 | 12/2002 | Mak et al. |
| 2003/0013300 A1 | 1/2003 | Byun |
| 2003/0013320 A1 | 1/2003 | Kim et al. |
| 2003/0017697 A1 | 1/2003 | Choi et al. |
| 2003/0031807 A1 | 2/2003 | Elers et al. |
| 2003/0032281 A1 | 2/2003 | Werkhoven et al. |
| 2003/0038369 A1 | 2/2003 | Layadi et al. |
| 2003/0042630 A1 | 3/2003 | Babcoke et al. |
| 2003/0049931 A1 | 3/2003 | Byun et al. |
| 2003/0049942 A1 | 3/2003 | Haukka et al. |
| 2003/0053799 A1 | 3/2003 | Lei |
| 2003/0054631 A1 | 3/2003 | Raaijmakers et al. |
| 2003/0057526 A1 | 3/2003 | Chung et al. |
| 2003/0057527 A1 | 3/2003 | Chung et al. |
| 2003/0059538 A1 | 3/2003 | Chung et al. |
| 2003/0072884 A1 | 4/2003 | Zhang et al. |
| 2003/0072975 A1 | 4/2003 | Shero et al. |
| 2003/0079686 A1 | 5/2003 | Chen et al. |
| 2003/0082296 A1 | 5/2003 | Elers et al. |
| 2003/0082300 A1 | 5/2003 | Todd et al. |
| 2003/0082301 A1 | 5/2003 | Chen et al. |
| 2003/0082307 A1 | 5/2003 | Chung et al. |

| | | |
|---|---|---|
| 2003/0089308 A1 | 5/2003 | Raaijmakers |
| 2003/0101927 A1 | 6/2003 | Raaijmakers et al. |
| 2003/0104126 A1 | 6/2003 | Fang et al. |
| 2003/0106490 A1 | 6/2003 | Jallepally et al. |
| 2003/0108674 A1 | 6/2003 | Chung et al. |
| 2003/0116087 A1 | 6/2003 | Nguyen et al. |
| 2003/0121608 A1 | 7/2003 | Chen et al. |
| 2003/0123216 A1 | 7/2003 | Yoon et al. |
| 2003/0124262 A1 | 7/2003 | Chen et al. |
| 2003/0129826 A1 | 7/2003 | Werkhoven et al. |
| 2003/0134508 A1 | 7/2003 | Raaijmakers et al. |
| 2003/0143328 A1 | 7/2003 | Chen et al. |
| 2003/0143839 A1 | 7/2003 | Raaijmakers et al. |
| 2003/0143841 A1 | 7/2003 | Yang et al. |
| 2003/0153181 A1 | 8/2003 | Yoon et al. |
| 2003/0161952 A1 | 8/2003 | Wang et al. |
| 2003/0165615 A1 | 9/2003 | Aaltonen et al. |
| 2003/0168750 A1 | 9/2003 | Basceri et al. |
| 2003/0173586 A1 | 9/2003 | Moriwaki et al. |
| 2003/0186495 A1 | 10/2003 | Saanila et al. |
| 2003/0190423 A1 | 10/2003 | Yang et al. |
| 2003/0190497 A1 | 10/2003 | Yang et al. |
| 2003/0190804 A1 | 10/2003 | Glenn et al. |
| 2003/0194493 A1 | 10/2003 | Chang et al. |
| 2003/0194825 A1 | 10/2003 | Law et al. |
| 2003/0203616 A1 | 10/2003 | Chung et al. |
| 2003/0205729 A1 | 11/2003 | Basceri et al. |
| 2003/0213987 A1 | 11/2003 | Basceri et al. |
| 2003/0219942 A1 | 11/2003 | Choi et al. |
| 2003/0224217 A1 | 12/2003 | Byun et al. |
| 2003/0224578 A1 | 12/2003 | Chung et al. |
| 2003/0224600 A1 | 12/2003 | Cao et al. |
| 2003/0232497 A1 | 12/2003 | Xi et al. |
| 2004/0005749 A1 | 1/2004 | Choi et al. |
| 2004/0009307 A1 | 1/2004 | Koh et al. |
| 2004/0011504 A1 | 1/2004 | Ku et al. |
| 2004/0013577 A1 | 1/2004 | Ganguli et al. |
| 2004/0013803 A1 | 1/2004 | Chung et al. |
| 2004/0014315 A1 | 1/2004 | Lai et al. |
| 2004/0014320 A1 | 1/2004 | Cheng et al. |
| 2004/0015300 A1 | 1/2004 | Ganguli et al. |
| 2004/0018304 A1 | 1/2004 | Chung et al. |
| 2004/0018723 A1 | 1/2004 | Byun et al. |
| 2004/0018747 A1 | 1/2004 | Lee et al. |
| 2004/0033698 A1 | 2/2004 | Lee et al. |
| 2004/0041320 A1 | 3/2004 | Hodumi |
| 2004/0043630 A1 | 3/2004 | Vaartstra et al. |
| 2004/0046197 A1 | 3/2004 | Basceri et al. |
| 2004/0077183 A1 | 4/2004 | Chung et al. |
| 2004/0187304 A1 | 9/2004 | Chen et al. |
| 2004/0214354 A1 | 10/2004 | Conley, Jr. et al. |
| 2004/0219784 A1 | 11/2004 | Kang et al. |
| 2004/0224506 A1 | 11/2004 | Choi et al. |
| 2004/0235285 A1 | 11/2004 | Kang et al. |
| 2004/0256351 A1 | 12/2004 | Chung et al. |
| 2005/0006799 A1 | 1/2005 | Brock et al. |
| 2005/0009325 A1 | 1/2005 | Chung et al. |
| 2005/0059240 A1 | 3/2005 | Choi et al. |
| 2005/0104142 A1 | 5/2005 | Narayanan et al. |

OTHER PUBLICATIONS

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. Vol. 670, (2001), pp. K2.2.1-K2.2.6.

Eisenbraun, et al. "Atomic Layer Deposition (ALD) of Tantalum-based materials for zero thickness copper barrier applications," Proceedings of the IEEE 2001 International Interconnect Technology Conference (Cat. No. 01EX461), 2001.

Goswami, et al. Transition Metals Show Promise as Copper Barriers, Semiconductor International, ATMI, San Jose—May 1, 2004, Semiconductor International, pp. 1-7.

Hong, et al. "Characteristics of PAALD-TaN thin films derived from TAIMATA precursor for copper metallization," Interconnect Technology Conference, 2004, Proceedings of the IEEE 2004 International, Jun. 7-9, 2004, pp. 9-11.

Hwang, et al. "Nanometer-Size a-$PbO_2$-type $TiO_2$ in Garnet: A Thermobarometer for Ultrahigh-Pressure Metamorphism," Science vol. 288, (Apr. 14, 2000), pp. 321-324.

Kim, et al. "Atomic Layer Deposition of Low Resistivity and High-Density Tungsten Nitride Thin Film Using $B_2H_6$, $WF_6$ and $NH_3$," Electrochem. Solid-State Lett., vol. 9, Issue 3, (2006), pp. C54-C57.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; pp. 1670-1675.

Kukli, et al. "In situ Study of Atomic Layer Epitaxy Growth of Tantalum Oxide Thin Films Fro $Ta(OC_2H_5)_5$ and $H_2O$," Applied Surface Science, vol. 112, Mar. 1997, pp. 236-242.

Kukli, et al. "Properties of $\{Nb_{1-x}Ta_x\}_2O_5$ Solid Solutions and $\{Nb_{1-x}Ta_x\}_2O_5$-$ZrO_2$ Nanolaminates Grown by Atomic Layer Epitaxy," NanoStructured Materials, vol. 8, No. 7, Elsevier Science Ltd., 1997; pp. 785-793.

Kukli, et al. "Properties of $Ta_2O_5$-Based Dielectric Nanolaminates Deposited by Atomic Layer Epitaxy," Journal of the Electrochemical Society, vol. 144, No. 1, Jan. 1997; pp. 300-306.

Kukli, et al. "Tailoring the Dielectric Properties of $HfO_2$-$Ta_2$-$O_5$ Nanolaminates," Applied Physics Letters, vol. 68, No. 26, Jun. 24, 1996; pp. 3737-3739.

Martensson, et al. "Use of Atomic Layer Epitaxy for Fabrication of Si/TiN/Cu Structures," J. Vac. Sci. & Tech. B, vol. 17, No. 5, (Sep. 1999), pp. 2122-2128.

Maydan, "Cluster Tools for Fabrication of Advanced Devices" Jap. J of Applied Physics, Extended Abstracts 22nd Conference Solid State Devices and Materials (1990), pp. 849-852.

Park, et al. "Performance improvement of MOSFET with $HfO_2$-$Al_2O_3$ laminate gate dielectric and CVD-TaN metal gate deposited by TAIMATA," Electron Devices Meeting, 2003, IEDM '03 Technical Digest. IEEE International Dec. 8-10, 2003, pp. 13.6.1-13.6.4.

Proceedings of the ICEEE 1998 International Interconnect Technology Conference—San Francisco, California, Jun. 1-3, 1998.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala, et al. "Atomic Layer Epitaxy Growth of TiN Thin Films From $TiI_4$ and $NH_3$," J. Electrochem. Soc., vol. 145, No. 8 (Aug., 1998), pp. 2914-2920.

Ritala, et al. "Effects of Intermediate Zinc Pulses on Properties of TiN and NbN Films by Atomic Layer Epitaxy," Applied Surface Science, vol. 120, No. 3-4, (Dec. 1997), pp. 199-212.

Ritala, et al. "Growth of Titanium Dioxide Thin Films by Atomic Layer Epitaxy," Thin Solid Films, vol. 225, No. 1-2 (Mar. 25, 1993), pp. 288-295.

Ritala, et al. "Surface Roughness Reduction in Atomic Layer Epitaxy Growth of Titanium Dioxide Thin Films," Thin Solid-Films, vol. 249, No. 2 (Sep. 15, 1994), pp. 155-162.

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.

Shenai, et al. "Correlation of vapor pressure equation and film properties with trimethylindium purity for the MOVPE grown III-V compounds," Journal of Crystal Growth 248 (2003), pp. 91-98.

Yang, et al. "Atomic Layer Deposition of Tungsten Film from $WF_6$/$B_2H_6$: Nucleation Layer for Advanced Semiconductor Devices," Conference Proceedings ULSI XVII (2002), Materials Research Society, pp. 655-660.

* cited by examiner

METHOD FOR DEPOSITING TUNGSTEN-CONTAINING LAYERS BY VAPOR DEPOSITION TECHNIQUES

CROSS-REFERENCE TO RELATED APPLICATIONS

This application is a continuation of U.S. Ser. No. 09/678,266, filed Oct. 3, 2000, and issued as U.S. Pat. No. 7,101,795, which is a continuation-in-part of U.S. Ser. No. 09/605,593, filed Jun. 28, 2000, and issued as U.S. Pat. No. 6,551,929, which are herein incorporated by reference in their entirety.

BACKGROUND OF THE INVENTION

1. Field of the Invention

This invention relates to the processing of semiconductor substrates. More particularly, this invention relates to improvements in the process of depositing refractory metal layers on semiconductor substrates.

2. Description of the Related Art

The semiconductor processing industry continues to strive for larger production yields while increasing the uniformity of layers deposited on substrates having larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer. Chemical Vapor Deposition (CVD) is one of the most common deposition processes employed for depositing layers on a substrate. CVD is a flux-dependent deposition technique that requires precise control of the substrate temperature and precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates superior step coverage, compared to CVD, and is Atomic Layer Deposition (ALD). ALD is based upon Atomic Layer Epitaxy (ALE) that was employed originally to fabricate electroluminescent displays. ALD employs chemisorption to deposit a saturated monolayer of reactive precursor molecules on a substrate surface. This is achieved by alternatingly pulsing an appropriate reactive precursor into a deposition chamber. Each injection of a reactive precursor is separated by an inert gas purge to provide a new atomic layer additive to previously deposited layers to form a uniform layer on the substrate. The cycle is repeated to form the layer to a desired thickness. A drawback with ALD techniques is that the deposition rate is much lower than typical CVD techniques by at least one order of magnitude.

Formation of film layers at a high deposition rate while providing adequate step coverage are conflicting characteristics often necessitating sacrificing one to obtain the other. This conflict is true particularly when refractory metal layers are deposited to cover gaps or vias during formation of contacts that interconnect adjacent metallic layers separated by dielectric layers. Historically, CVD techniques have been employed to deposit conductive material such as refractory metals in order to inexpensively and quickly form contacts.

Due to the increasing integration of semiconductor circuitry, tungsten has been used based upon superior step coverage. As a result, deposition of tungsten employing CVD techniques enjoys wide application in semiconductor processing due to the high throughput of the process.

Depositing tungsten by traditional CVD methods, however, is attendant with several disadvantages. For example, blanket deposition of a tungsten layer on a semiconductor wafer is time-consuming at temperatures below 400° C. The deposition rate of tungsten may be improved by increasing the deposition temperature to, e.g., about 500° C. to about 550° C.; however, temperatures in this higher range may compromise the structural and operational integrity of the underlying portions of the integrated circuit being formed. Use of tungsten has also frustrated photolithography steps during the manufacturing process as it results in a relatively rough surface having a reflectivity of 20% or less than that of a silicon substrate. Finally, tungsten has proven difficult to deposit uniformly. Variance in film thickness of greater than 1% has been shown with tungsten, thereby frustrating control of the resistivity of the layer. Several prior attempts to overcome the aforementioned drawbacks have been attempted.

For example, in U.S. Pat. No. 5,028,565 to Chang et al., which is assigned to the assignee of the present invention, a method is disclosed to improve, inter alia, uniformity of tungsten layers by varying the deposition chemistry. The method includes, in pertinent part, formation of a nucleation layer over an intermediate barrier, layer before depositing the tungsten layer via bulk deposition. The nucleation layer is formed from a gaseous mixture of tungsten hexafluoride, hydrogen, silane, and argon. The nucleation layer is described as providing a layer of growth sites to promote uniform deposition of a tungsten layer thereon. The benefits provided by the nucleation layer are described as being dependent upon the barrier layer present. For example, were the barrier layer formed from titanium nitride the tungsten layer's thickness uniformity is improved as much as 15%. Were the barrier layer formed from sputtered tungsten or sputtered titanium tungsten, the benefits provided by the nucleation layer are not as pronounced.

U.S. Pat. No. 5,879,459 to Gadgil et al. discloses an apparatus that takes advantage of ALD. To that end, the apparatus, a low profile, compact atomic layer deposition reactor (LP-CAR), has a body with a substrate processing region adapted to serve a single substrate or a planar array of substrates, as well as a valve, and a port for substrate loading and unloading. In some embodiments multiple reactors are stacked vertically and share a common robotic handler interface with a CVD system. In this manner, the robotic handler may manipulate substrates associated with both the CVD system and the LP-CAR. The compact reactor is distinguished by having individual injectors, each of which comprises a charge tube formed between a charge valve and an injection valve. The charge valve connects the charge tube to a pressure regulated supply, and the injection valve opens the charge tube into the compact reactor. Rapidly cycling the valves injects fixed mass-charges of gas or vapor into the compact reactor.

What is needed, however, is a technique to deposit conductive layers having a deposition rate comparable to CVD techniques while providing the step coverage associated with ALD techniques.

SUMMARY OF THE INVENTION

A method and system to form a refractory metal layer on a substrate features nucleating a substrate using sequential deposition techniques in which the substrate is serially exposed to first and second reactive gases followed by forming a layer, employing vapor deposition, to subject the nucleation layer to a bulk deposition of a compound contained in one of the first and second reactive gases. To that end, the system includes a processing chamber that has a holder disposed therein to support the substrate. A gas delivery system and a pressure control system is in fluid communication with the processing chamber. A temperature control system is in thermal communication therewith. A controller is in electrical communication with gas delivery systems, temperature control systems, pressure control systems. A memory is in data communication with the controller. The memory comprises a computer-readable medium having a computer-readable program embodied therein. The computer readable program includes instructions for controlling the operation of the processing chamber.

DETAILED DESCRIPTION

Figure 1:
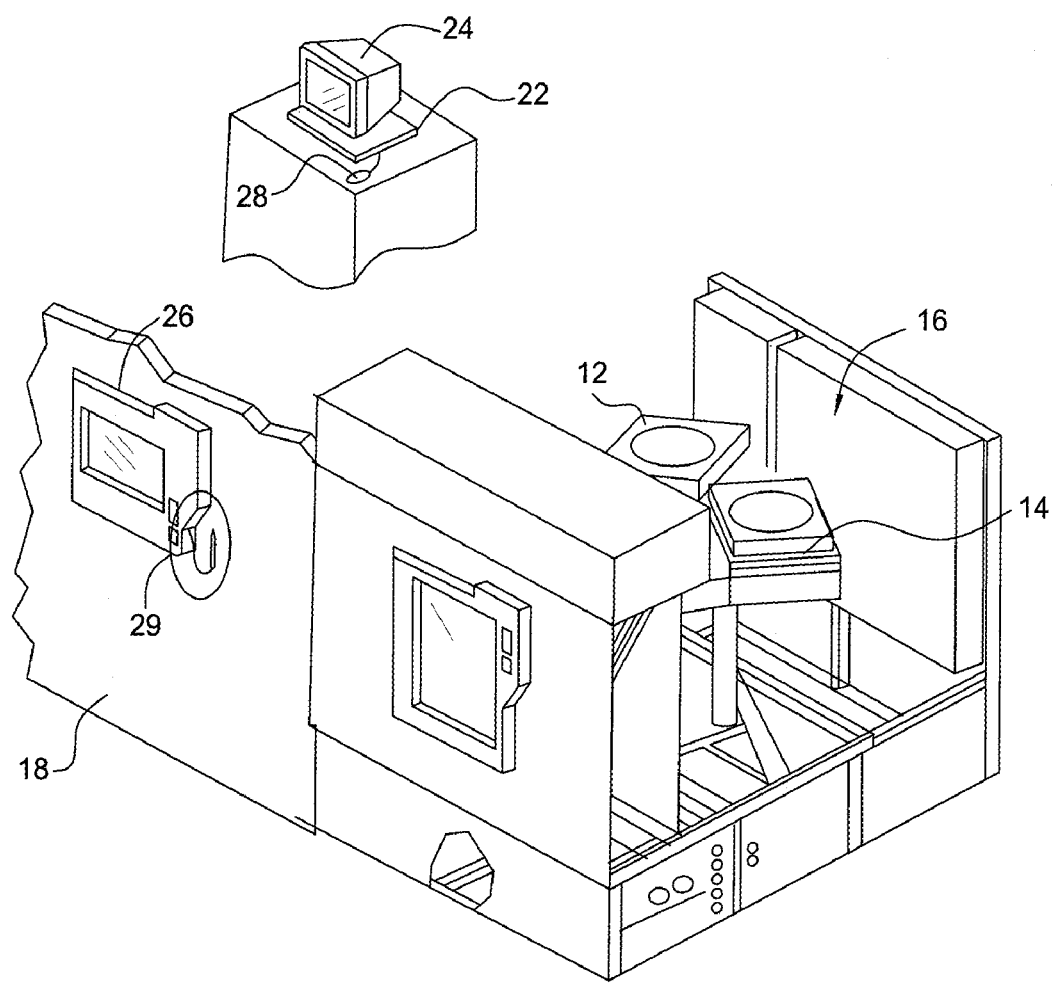
FIG. 1 is a perspective view of a semiconductor processing system in accordance with the present invention.

Referring to FIG. 1, an exemplary wafer processing system includes one or more processing chambers 12 and 14 disposed in a common work area 16 surrounded by a wall 18. The processing chambers 12 and 14 are in data communication with a controller 22 that is connected to one or more monitors, shown as 24 and 26. The monitors typically display common information concerning the process associated with the processing chambers 12 and 14. One of the monitors 26 is mounted to the wall 18, with the remaining monitor 24 being disposed in the work area 16. Operational control of the processing chambers 12 and 14 may be achieved by the use of a light pen, associated with one of the monitors 24 and 26, to communicate with the controller 22. For example, light pen 28 is associated with monitor 24 and facilitates communication with the controller 22 through monitor 24. Light pen 29 facilitates communication with the controller 22 through monitor 26.

Figure 2:
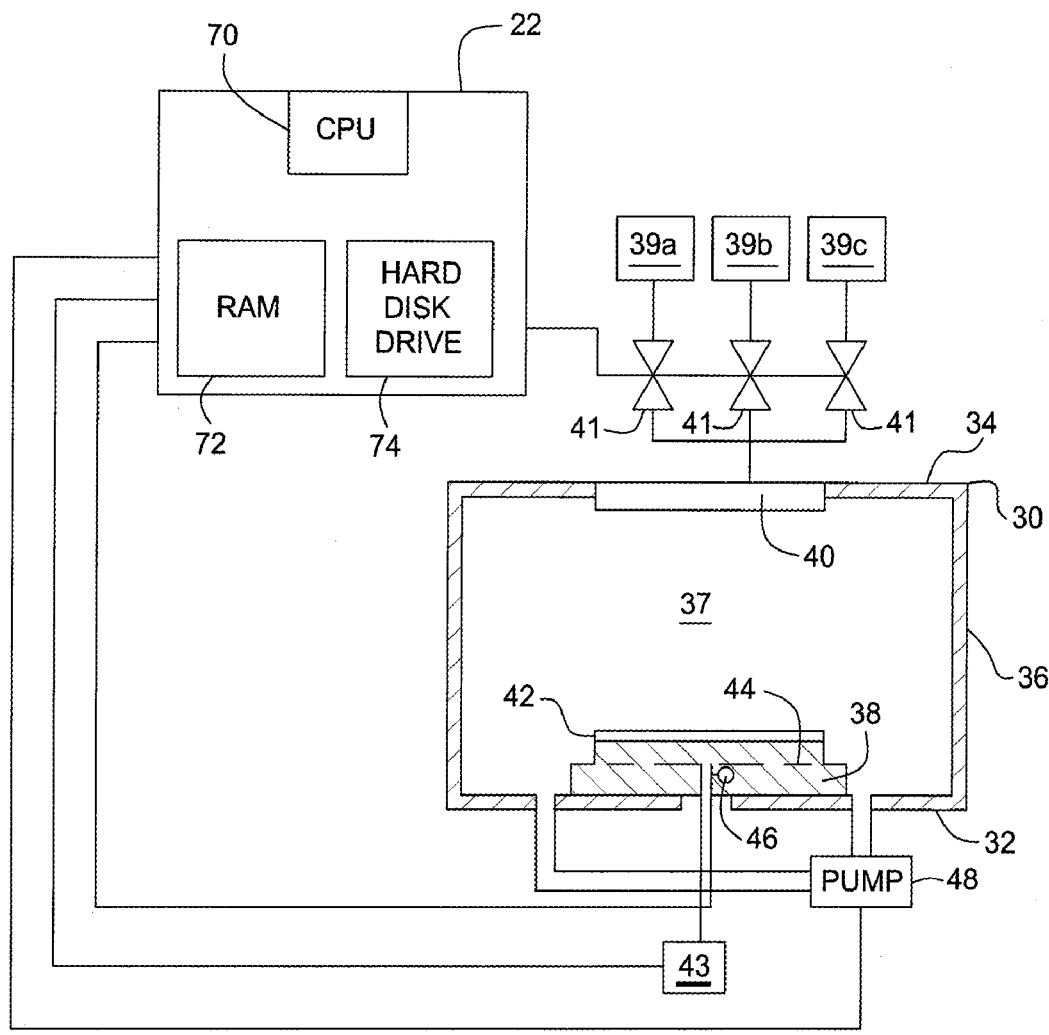
FIG. 2 is a detailed view of the processing chambers shown in FIG. 1.

Referring both the to FIGS. 1 and 2, each of the processing chambers 12 and 14 includes a housing 30 having a base wall 32, a cover 34, disposed opposite to the base wall 32, and a sidewall 36, extending therebetween. The housing 30 defines a chamber 37, and a pedestal 38 is disposed within the processing chamber 37 to support a substrate 42, such as a semiconductor wafer. The pedestal 38 may be mounted to move between the cover 34 and the base wall 32, using a displacement mechanism (not shown), but the position thereof is typically fixed. Supplies of processing gases 39a, 39b, and 39c are in fluid communication with the processing chamber 37 via a showerhead 40. Regulation of the flow of gases from the supplies 39a, 39b, and 39c is effectuated via flow valves 41.

Depending on the specific process, the substrate 42 may be heated to a desired temperature prior to layer deposition via a heater embedded within the pedestal 38. For example, the pedestal 38 may be resistively heated by applying an electric current from an AC power supply 43 to the heater element 44. The substrate 42 is, in turn, heated by the pedestal 38, and can be maintained within a desired process temperature range of, for example, about 20° C. to about 750° C. A temperature sensor 46, such as a thermocouple, is also embedded in the wafer support pedestal 38 to monitor the temperature of the pedestal 38 in a conventional manner. For example, the measured temperature may be used in a feedback loop to control the electrical current applied to the heater element 44 by the power supply 43 such that the substrate temperature can be maintained or controlled at a desired temperature that is suitable for the particular process application. Optionally, the pedestal 38 may be heated using radiant heat (not shown). A vacuum pump 48 is used to evacuate the processing chamber 37 and to help maintain the proper gas flows and pressure inside the processing chamber 37.

Figure 3:
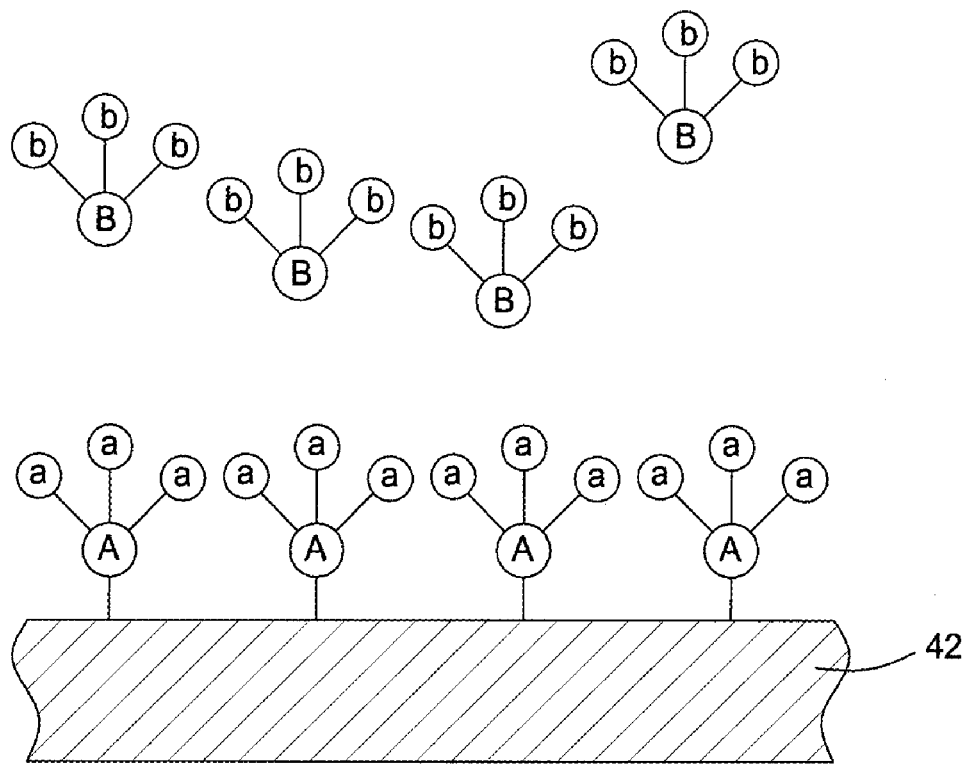
FIG. 3 is a schematic view showing deposition of a first molecule onto a substrate during ALD.

Referring to FIGS. 1 and 3, one or both of the processing chambers 12 and 14, discussed above may operate to deposit refractory metal layers on the substrate employing sequential deposition techniques. One example of sequential deposition techniques in accordance with the present invention includes atomic layer deposition (ALD). Depending on the specific stage of processing, the refractory metal layer may be deposited on the material from which the substrate 42 is fabricated, e.g., $SiO_2$. The refractory metal layer may also be deposited on a layer previously formed on the substrate 42, e.g., titanium, titanium nitride and the like.

During the sequential deposition technique in accordance with the present invention, a batch of a first processing gas, in this case $Aa_x$, results in a layer of A being deposited on the substrate 42 having a surface of ligand a exposed to the processing chamber 37. Thereafter, a purge gas enters the processing chamber 37 to purge the gas $Aa_x$. After purging gas $Aa_x$ from the processing chamber 37, a second batch of processing gas, $Bb_y$, is introduced into the processing chamber 37. The a ligand present on the substrate surface reacts with the b ligand and B atom on the releasing molecules ab and Ba, that move away from the substrate 42 and are subsequently pumped from the processing chamber 37. In this manner, a surface comprising a layer of A compound remains upon the substrate 42 and exposed to the processing chamber 37, shown in FIG. 4. The composition of the layer of A compound may be a monolayer of atoms typically formed employing ALD techniques. Alternatively, the layer of compound A may include a layer of multiple atoms. In such as case, the first processing gases may include a mixture of process gases each of which has atoms that would adhere to the substrate 42. The process proceeds cycle after cycle, until the desired thickness is achieved.

Figure 5:
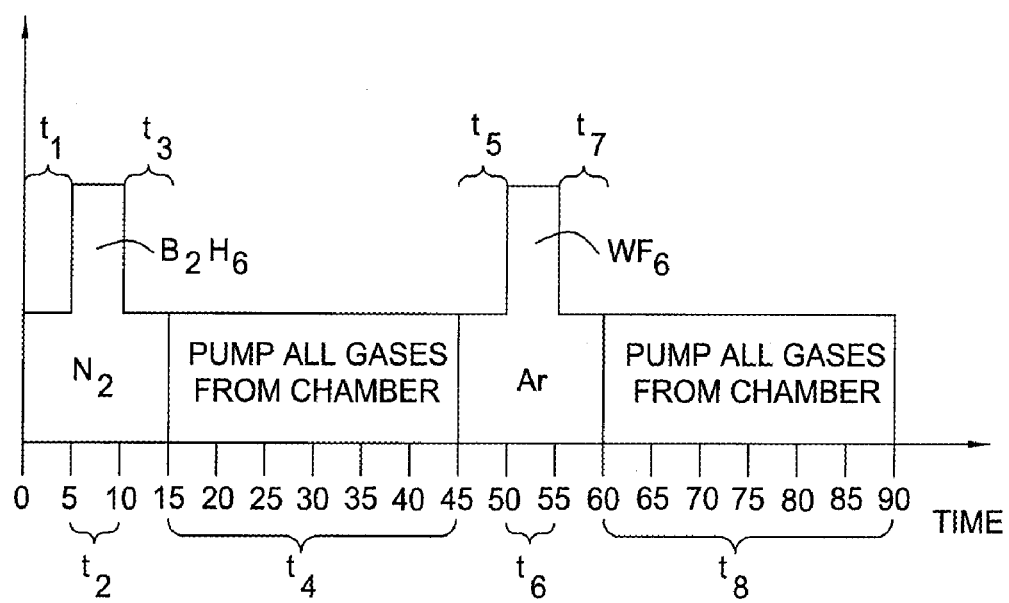
FIG. 5 is a graphical representation showing the concentration of gases, introduced into the processing chamber shown in FIG. 2, and the time in which the gases are present in the processing chamber, in accordance with the present invention.

Referring to both FIGS. 2 and 5, although any type of processing gas may be employed, in the present example, the processing gas $Aa_x$ includes $WF_6$ and the processing gas $Bb_y$ is $B_2H_6$. Two purge gases are employed: Ar and $N_2$. Each of the processing gases was flowed into the processing chamber 37 with a carrier gas, which in this example were one of the purge gases: $WF_6$ is introduced with Ar and $B_2H_6$ is introduced with $N_2$. It should be understood, however, that the purge gas may differ from the carrier gas, discussed more fully below. One cycle of the ALD technique in accordance with the present invention includes flowing the purge gas, $N_2$, into the processing chamber 37 during time $t_1$, which is approximately 0.01 seconds to 15 seconds before $B_2H_6$ is flowed into the processing chamber 37. During time $t_2$, the processing gas $B_2H_6$ is flowed into the processing chamber 37 for a time in the range of 0.01 seconds to 15 seconds, along with a carrier gas, which in this example is $N_2$. After 0.01 seconds to 15 seconds have lapsed, the flow of $B_2H_6$ terminates and the flow of $N_2$ continues during time $t_3$ for an additional time in the range of 0.01 seconds to 15 seconds, purging the processing chamber of $B_2H_6$. During time $t_4$, the processing chamber 37 is pumped so as to remove most, if not all, gases. After pumping of the process chamber 37, the carrier gas Ar is introduced for a time in the range of 0.01 seconds to 15 seconds during time $t_5$, after which time the process gas $WF_6$ is introduced into the processing chamber 37, along with the carrier gas Ar during time $t_6$. The time $t_6$ lasts between 0.01 seconds to 15 seconds. The flow of the processing gas $WF_6$ into the processing chamber 37 is terminated approximately 0.01 seconds to 15 seconds after it commenced. After the flow of $WF_6$ into the processing chamber 37 terminates, the flow of Ar continues for an additional time in the range of 0.01 seconds to 15 seconds, during time $t_7$. Thereafter, the processing chamber 37 is pumped so as to remove most, if not all, gases therein, during time $t_8$. As before, the pumping process lasts approximately thirty seconds, thereby concluding one cycle of the sequential deposition technique in accordance with the present invention.

The benefits of employing the sequential deposition technique are manifold, including flux-independence of layer formation that provides uniformity of deposition independent of the size of a substrate. For example, the measured difference of the layer uniformity and thickness measured between a 200 mm substrate and a 32 mm substrate deposited in the same chamber is negligible. This is due to the self-limiting characteristics of the sequential deposition techniques. Further, this technique contributes to a near-perfect step coverage over complex topography.

Figure 4:
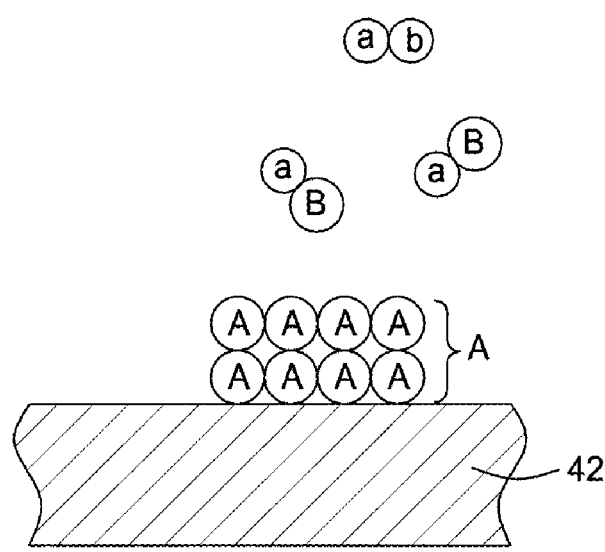
FIG. 4 is a schematic view showing deposition of second molecule onto a substrate during ALD to form a refractory metal layer.
Figure 6:
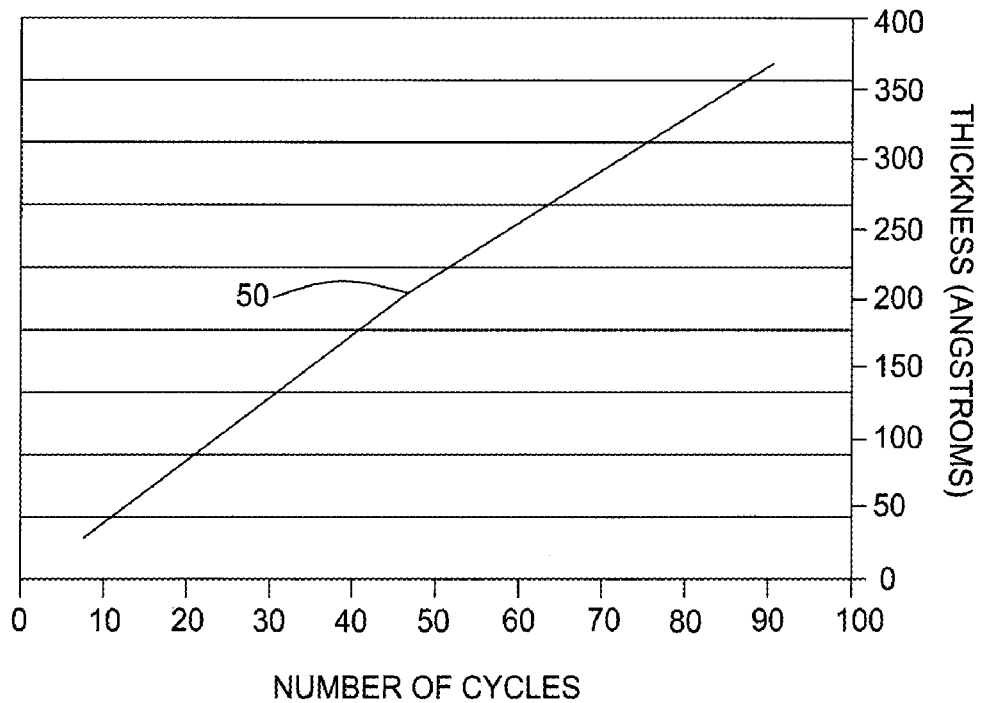
FIG. 6 is a graphical representation showing the relationship between the number of ALD cycles and the thickness of a layer formed on a substrate employing ALD, in accordance with the present invention.
Figure 7:
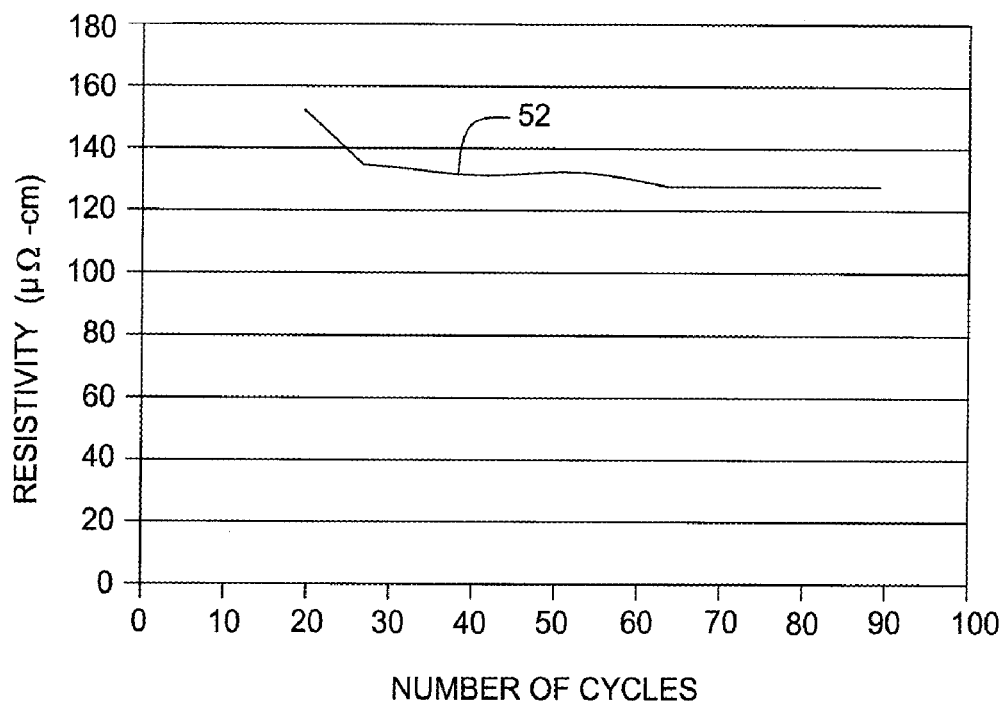
FIG. 7 is a graphical representation showing the relationship between the number of ALD cycles and the resistivity of a layer formed on a substrate employing ALD, in accordance with the present invention.

In addition, the thickness of the layer B, shown in FIG. 4, may be easily controlled while minimizing the resistance of the same by employing sequential deposition techniques. With reference to FIG. 6 it is seen in the slope of line 50 that the thickness of the tungsten layer B is proportional to the number of cycles employed to form the same. The resistivity of the tungsten layer, however, is relatively independent of the thickness of the layer, as shown by the slope of line 52 in FIG. 7. Thus, employing sequential deposition techniques, the thickness of a refractory metal layer may be easily controlled as a function of the cycling of the process gases introduced into the processing chamber with a negligible effect on the resistivity.

Figure 8:
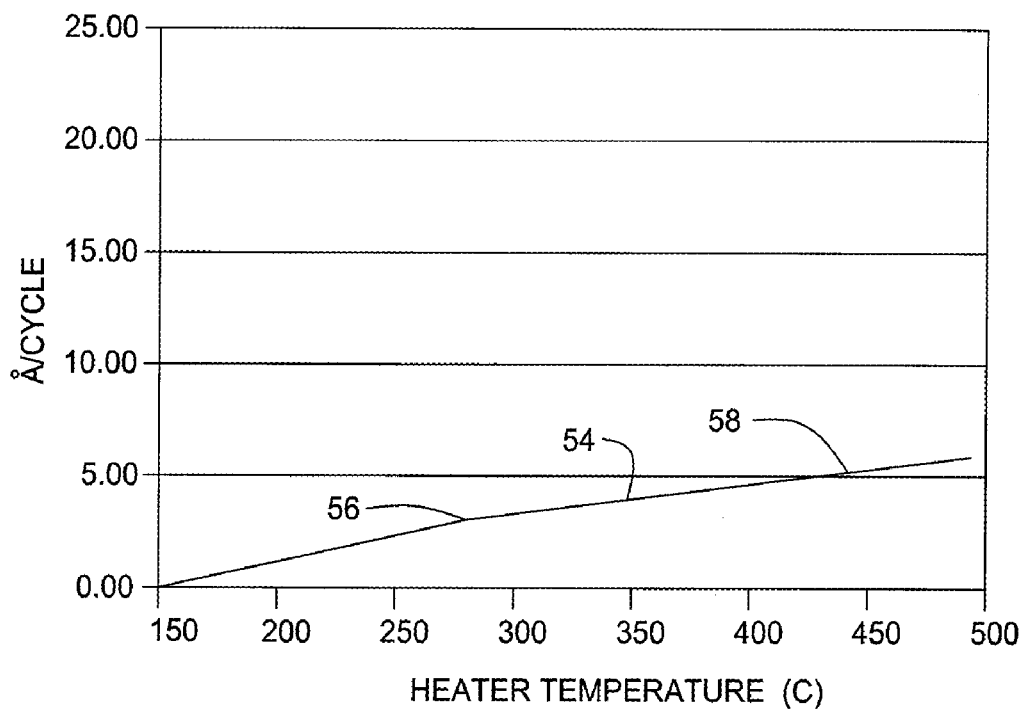
FIG. 8 is a graphical representation showing the relationship between the deposition rate of a layer formed on a substrate employing ALD and the temperature of the substrate.
Figure 9:
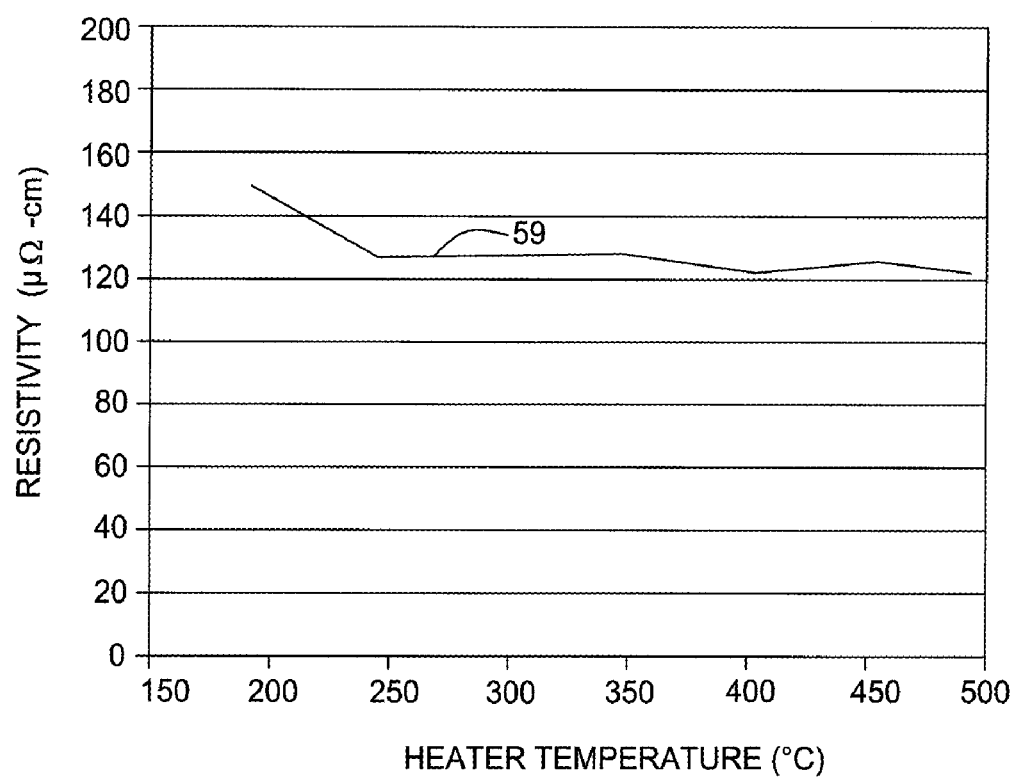
FIG. 9 is a graphical representation showing the relationship between the resistivity of a layer formed on a substrate employing ALD and the temperature of the substrate, in accordance with the present invention.

Referring to FIG. 8, control of the deposition rate was found to be dependent upon the temperature of the substrate 42. As shown by the slope of line 54, increasing the temperature of the substrate 42 increased the deposition rate of the tungsten layer B. For example, at 56, the deposition rate is shown to be approximately 2 Å/cycle at a temperature of 250° C. However at point 56 the deposition rate is approximately 5 Å/cycle at a temperature of 450° C. The resistivity of the tungsten layer, however, is virtually independent of the layer thickness, as shown by the slope of curve 58, shown in FIG. 9. As a result, the deposition rate of the tungsten layer may be controlled as a function of temperature without compromising the resistivity of the same. However, it may be desired to reduce the time necessary to deposit an entire layer of a refractory metal.

Figure 10:
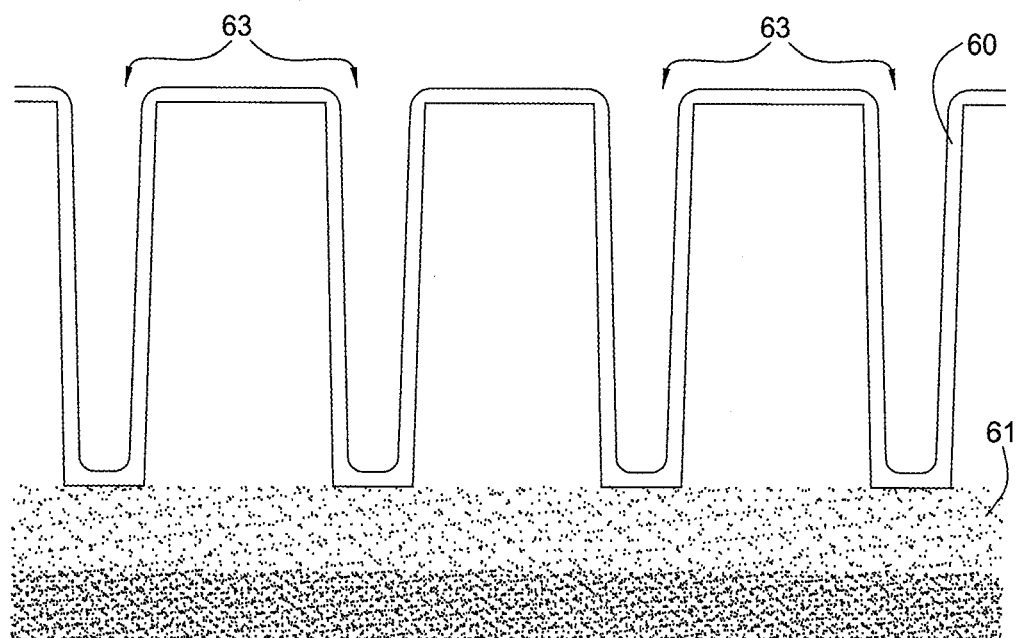
FIG. 10 is a cross-sectional view of a patterned substrate having a nucleation layer formed thereon employing ALD, in accordance with the present invention.
Figure 11:
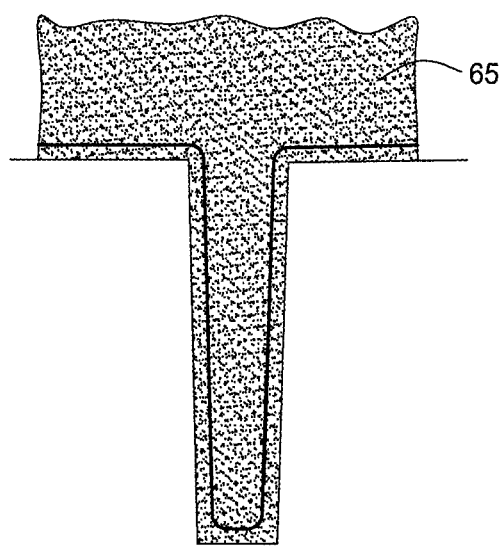
FIG. 11 is a partial cross-sectional view of the substrate, shown in FIG. 10, with a refractory metal layer formed atop of the nucleation layer employing CVD, in accordance with the present invention.

To that end, a bulk deposition of the refractory metal layer may be included in the deposition process. Typically, the bulk deposition of the refractory metal occurs after the nucleation layer is formed in a common processing chamber. Specifically, in the present example, nucleation of a tungsten layer occurs in chamber 12 employing the sequential deposition techniques discussed above, with the substrate 42 being heated in the range of 200° C. to 400° C., and the processing chamber 37 being pressurized in the range of 1 Torr to 10 Torr. A nucleation layer 60 of approximately 12 nm to 20 nm is formed on a patterned substrate 42, shown in FIG. 10. As shown, the substrate 42 includes a barrier layer 61 and a patterned layer having a plurality of vias 63. The nucleation layer is formed adjacent to the patterned layer covering the vias 63. As shown, forming the nucleation layer 60 employing ALD techniques provides 100% step coverage. To decrease the time required to form a complete layer of tungsten, a bulk deposition of tungsten onto the nucleation layer 60 occurs using CVD techniques, while the substrate 42 is disposed in the same processing chamber 12, shown in FIG. 1. The bulk deposition may be performed using recipes well known in the art. In this manner, a tungsten layer 65 providing a complete plug fill is achieved on the patterned layer with vias having aspect ratios of approximately 6:1, shown in FIG. 11.

Figure 12:
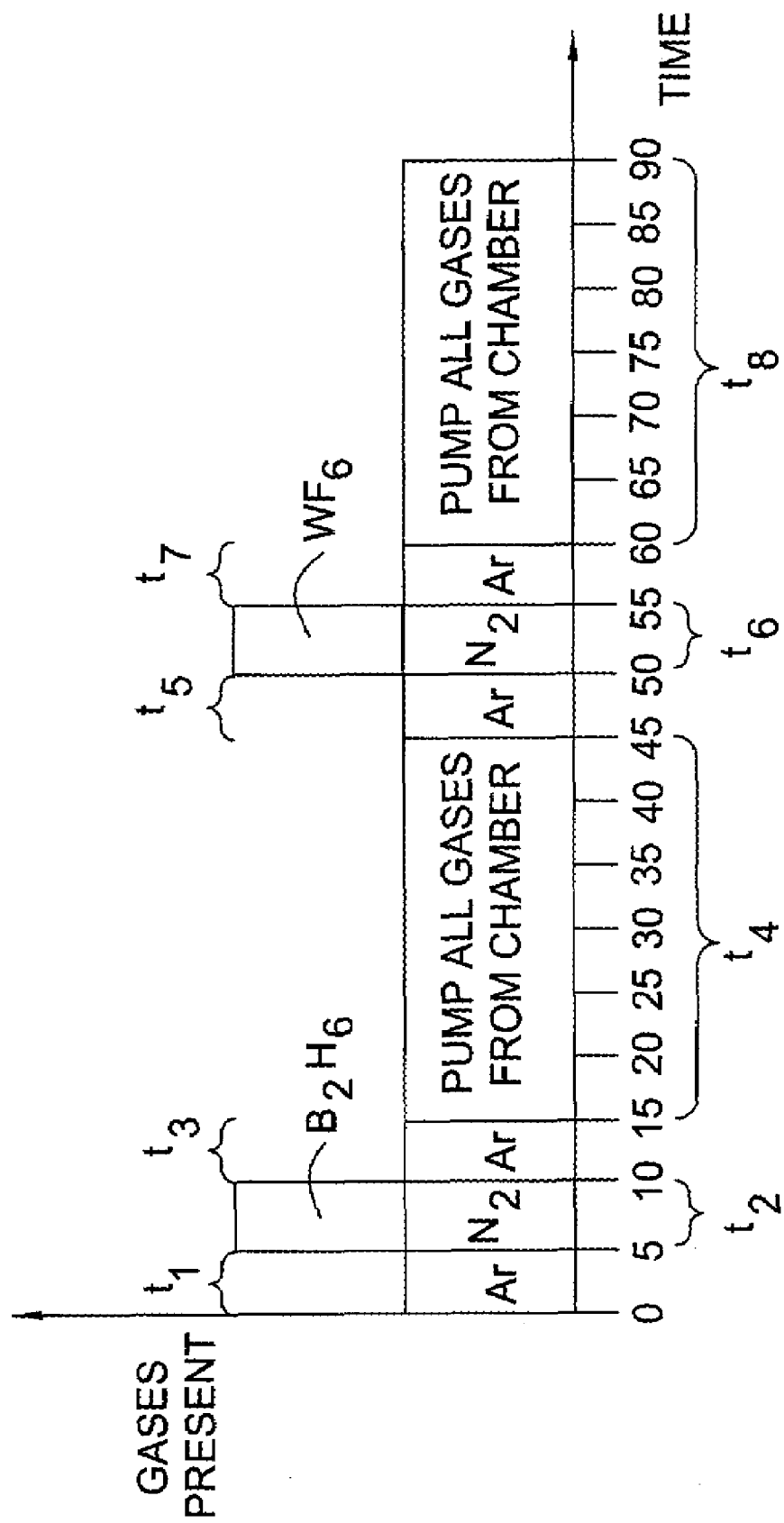
FIG. 12 is a graphical representation showing the concentration of gases shown in FIG. 3, in accordance with a first alternate embodiment of the present invention.

As mentioned above, in an alternate embodiment of the present invention, the carrier gas may differ from the purge gas, as shown in FIG. 12. The purge gas, which is introduced at time intervals $t_1$, $t_3$, $t_5$, and $t_7$ comprises of Ar. The carrier gas, which is introduced at time intervals $t_2$ and $t_6$, comprises of $N_2$. Thus, at time interval $t_2$ the gases introduced into the processing chamber include a mixture of $B_2H_6$ and $N_2$, and a time interval $t_6$, the gas mixture includes $B_2H_6$ and $N_2$. The pump process during time intervals $t_4$ and $t_8$ is identical to the pump process discussed above with respect to FIG. 5.

Referring again to FIG. 2, the process for depositing the tungsten layer may be controlled using a computer program product that is executed by the controller 22. To that end, the controller 22 includes a central processing unit (CPU) 70, a volatile memory, such as a random access memory (RAM) 72 and permanent storage media, such as a floppy disk drive for use with a floppy diskette, or hard disk drive 74. The computer program code can be written in any conventional computer readable programming language; for example, 68000 assembly language, C, C++, Pascal, FORTRAN and the like. Suitable program code is entered into a single file, or multiple files, using a conventional text editor and stored or embodied in a computer-readable medium, such as the hard disk drive 74. If the entered code text is in a high level language, the code is compiled and the resultant compiler code is then linked with an object code of precompiled WINDOWS® library routines. To execute the linked and, compiled object code the system user invokes the object code, causing the CPU 70 to load the code in RAM 72. The CPU 70 then reads and executes the code to perform the tasks identified in the program.

Although the invention has been described in terms of specific embodiments, one skilled in the art will recognize that various changes to the reaction conditions, i.e., temperature, pressure, film thickness and the like can be substituted and are meant to be included herein. Additionally, while the deposition process has been described as occurring in the same chamber, it may be bifurcated. In this manner, the nucleation layer may be deposited in one chamber and the bulk deposition occurring in a differing chamber, located within the same mainframe deposition system. However, the bulk deposition may occur in a processing chamber of a mainframe deposition system that is different from the mainframe deposition system in which the processing chamber is located that is employed to deposit the nucleation layer. Finally, other refractory metals may be deposited, in addition to tungsten, and other deposition techniques may be employed in lieu of CVD. For example, physical vapor deposition (PVD) techniques, or a combination of both CVD and PVD techniques may be employed. The scope of the invention should not be based upon the foregoing description. Rather, the scope of the invention should be determined based upon the claims recited herein, including the full scope of equivalents thereof.

The invention claimed is:

1. A method for forming a tungsten-containing material on a substrate, comprising:
   forming a tungsten nucleation layer by sequentially exposing a substrate to a boron-containing gas and a tungsten-containing gas within a processing chamber during an atomic layer deposition process; and
   forming a tungsten bulk layer on the tungsten nucleation layer by exposing the substrate to a processing gas comprising the tungsten-containing gas and a reactive precursor gas within another processing chamber during a chemical vapor deposition process.

2. The method of claim 1, wherein the boron-containing gas comprises diborane.

3. The method of claim 2, wherein the tungsten-containing gas comprises tungsten hexafluoride.

4. The method of claim 3, wherein the substrate is exposed to argon gas prior to sequentially exposing the substrate to the boron-containing gas and the tungsten-containing gas.

5. The method of claim 1, wherein the tungsten nucleation layer is deposited on a barrier layer disposed on the substrate.

6. The method of claim 5, wherein the barrier layer comprises a material selected from the group consisting of titanium, titanium nitride, and combinations thereof.

7. The method of claim 1, wherein the tungsten nucleation layer is deposited on a silicon-containing layer disposed on the substrate.

8. The method of claim 7, wherein the silicon-containing layer comprises silicon oxide.

9. The method of claim 1, wherein the reactive precursor gas comprises a gas selected from the group consisting of silane, hydrogen, argon, and combinations thereof.

10. A method for forming a tungsten-containing material on a substrate, comprising:
    providing a substrate comprising a dielectric surface into a processing chamber;
    exposing the dielectric surface to tungsten hexafluoride for a predetermined time within the processing chamber;
    depositing a first tungsten-containing layer on the dielectric surface by sequentially exposing the substrate to the tungsten hexafluoride and a reactive precursor gas within the processing chamber during an atomic layer deposition process, wherein the reactive precursor gas comprises a nitrogen-containinci gas; and
    depositing a second tungsten-containing layer on the first tungsten-containing layer by exposing the substrate to the tungsten hexafluoride and another reactive precursor gas during a vapor deposition process.

11. The method of claim 10, wherein the dielectric surface comprises a silicon-containing material.

12. The method of claim 11, wherein the silicon-containing layer comprises silicon oxide.

13. The method of claim 10, wherein the second tungsten-containing layer is deposited on the first tungsten-containing layer within the processing chamber.

14. The method of claim 10, wherein the predetermined time is within a range from about 0.01 seconds to about 15 seconds.

15. A method for forming a tungsten-containing material on a substrate, comprising:
    positioning a substrate within a processing chamber, wherein the substrate comprises a plurality of vias formed therein;
    exposing the substrate sequentially to a boron-containing gas and a tungsten-containing gas to form a tungsten nucleation layer within the vias during an atomic layer deposition process;
    exposing the substrate to a flow of a processing gas comprising the tungsten-containing gas to form a tungsten bulk layer on the tungsten nucleation layer within the vias during a chemical vapor deposition process; and
    flowing the processing gas until the vias are filled with the tungsten bulk layer.

16. The method of claim 15, wherein the boron-containing gas comprises diborane.

17. The method of claim 16, wherein the tungsten-containing gas comprises tungsten hexafluoride.

18. The method of claim 17, wherein the substrate is exposed to argon gas prior to sequentially exposing the substrate to the boron-containing gas and the tungsten-containing gas.

19. The method of claim 15, wherein the tungsten nucleation layer is deposited on a barrier layer disposed within the vias on the substrate.

20. The method of claim 19, wherein the barrier layer comprises a material selected from the group consisting of titanium, titanium nitride, and combinations thereof.

21. The method of claim 15, wherein the tungsten nucleation layer is deposited on a silicon-containing layer disposed on the substrate.

22. The method of claim 21, wherein the silicon-containing layer comprises silicon oxide.

23. The method of claim 15, wherein the processing gas further comprises a reactive precursor gas.

24. The method of claim 23, wherein the reactive precursor gas comprises a gas selected from the group consisting of silane, hydrogen, argon, and combinations thereof.

25. The method of claim 15, wherein the vias comprises aspect ratios of about 6:1.

26. A method for forming a tungsten-containing material on a substrate, comprising:
    transferring a substrate to a first processing position within a processing system;
    forming a tungsten nucleation layer by sequentially exposing the substrate to a boron-containing gas and a tungsten-containing gas at the first processing position during an atomic layer deposition process;
    transferring the substrate to a second processing position within the processing system; and
    forming a tungsten bulk layer on the tungsten nucleation layer by exposing the substrate to a processing gas comprising the tungsten-containing gas and a reactive precursor gas at the second processing position during a chemical vapor deposition process.

27. The method of claim 26, wherein the boron-containing gas comprises diborane.

28. The method of claim 27, wherein the tungsten-containing gas comprises tungsten hexafluoride.

29. The method of claim 28, wherein the substrate is exposed to argon gas prior to sequentially exposing the substrate to the boron-containing gas and the tungsten-containing gas.

30. The method of claim 26, wherein the tungsten nucleation layer is deposited on a barrier layer disposed on the substrate.

31. The method of claim 30, wherein the barrier layer comprises a material selected from the group consisting of titanium, titanium nitride, and combinations thereof.

32. The method of claim 26, wherein the tungsten nucleation layer is deposited on a silicon-containing layer disposed on the substrate.

33. The method of claim 32, wherein the silicon-containing layer comprises silicon oxide.

34. The method of claim 26, wherein the reactive precursor gas comprises a gas selected from the group consisting of silane, hydrogen, argon, and combinations thereof.

35. A method for forming a tungsten-containing material on a substrate, comprising:
    transferring a substrate to a first processing position within a processing system;
    exposing the substrate to tungsten hexafluoride for a predetermined time at the first processing position;
    depositing a first tungsten-containing layer on the substrate by sequentially exposing the substrate to the tungsten hexafluoride and a reactive precursor gas during an atomic layer deposition process;
    transferring the substrate to a second processing position within the processing system; and
    depositing a second tungsten-containing layer on the first tungsten-containing layer by exposing the substrate to the tungsten hexafluoride and another reactive precursor gas during a vapor deposition process.

36. The method of claim 35, wherein the reactive precursor gas comprises a nitrogen-containing gas.

37. The method of claim 35, wherein first tungsten-containing layer is deposited at the first processing position.

38. The method of claim 35, wherein the predetermined time is within a range from about 0.01 seconds to about 15 seconds.

* * * * *

UNITED STATES PATENT AND TRADEMARK OFFICE
CERTIFICATE OF CORRECTION

| | |
|---|---|
| PATENT NO. | : 7,220,673 B2 |
| APPLICATION NO. | : 11/461909 |
| DATED | : May 22, 2007 |
| INVENTOR(S) | : Xi et al. |

It is certified that error appears in the above-identified patent and that said Letters Patent is hereby corrected as shown below:

In Column 8, Claim 10, Line 24, please delete "containinci" and insert --containing--.

Signed and Sealed this

Twenty-fourth Day of July, 2007

JON W. DUDAS
*Director of the United States Patent and Trademark Office*